United States Patent
Ratowsky et al.

(10) Patent No.: US 7,099,075 B2
(45) Date of Patent: Aug. 29, 2006

(54) TUNABLE SEGMENTED DISTRIBUTED BRAGG REFLECTOR FOR LINEAR OPTICAL AMPLIFIER

(75) Inventors: Richard P. Ratowsky, Berkeley, CA (US); Daniel A. Francis, Oakland, CA (US); Ashish K. Verma, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 161 days.

(21) Appl. No.: 10/934,603

(22) Filed: Sep. 3, 2004

(65) Prior Publication Data
US 2006/0050364 A1    Mar. 9, 2006

(51) Int. Cl.
*H01S 3/00* (2006.01)
*H01S 5/125* (2006.01)
(52) U.S. Cl. .................. 359/344; 372/50.11
(58) Field of Classification Search ........ 359/344; 372/50.11
See application file for complete search history.

(56) References Cited
U.S. PATENT DOCUMENTS 6,445,495 B1 * 9/2002 Walker et al. ............... 359/344
6,836,357 B1 * 12/2004 Wang et al. ................. 359/344
6,891,664 B1 * 5/2005 DiJaili et al. ............... 359/344
6,909,536 B1 * 6/2005 Walker et al. ............... 359/337

OTHER PUBLICATIONS

Kosonocky, et al., "GaAs Laser Amplifiers," *IEEE J. Quantum Electronics*, vol. QE-4, No. 4, Apr. 1968, pp. 125-131.
Bachmann, et al., "Polarisation-Insensitive Clamped-Gain SOA with Integreated Spot-size Convertor and DBR Gratings for WDM Applications at 1.55 μm Wavelength," *Electronics Letters*, vol. 32, No. 22, Oct. 24, 1996, pp. 2076-2078.

* cited by examiner

*Primary Examiner*—Mark Hellner
(74) *Attorney, Agent, or Firm*—Workman Nydegger

(57) ABSTRACT

Systems and methods for tuning a DBR stack for an optical amplifier. The DBR layers in a mirror of the optical amplifier have a duty cycle that can be altered to tune a location of a channel drop in a gain spectrum. In addition to changing the duty cycle, the DBR stacks can be segmented. The segmented DBR stacks and/or the selected duty cycle tunes a location of a channel drop outside of a range of wavelengths of interest.

31 Claims, 4 Drawing Sheets

A TUNABLE SEGMENTED DISTRIBUTED
BRAGG REFLECTOR FOR LINEAR
OPTICAL AMPLIFIER

RELATED APPLICATIONS

Not applicable.

BACKGROUND OF THE INVENTION

1. The Field of the Invention

The present invention relates to the field of semiconductor devices including optical amplifiers and semiconductor lasers. More particularly, the present invention relates to systems and methods for tuning a Distributed Bragg Reflector (DBR) mirror stack in a semiconductor device.

2. Related Technology

A linear optical amplifier is a semiconductor device that includes an active region. An optical signal incident to the active region is amplified and output by the optical amplifier. The active region is located between a p-type semiconductor layer and an n-type semiconductor layer. In one example, the p-type and n-type semiconductor layers include Distributed Bragg Reflector (DBR) layer stacks. As a result, the optical amplifier has a structure similar to a vertical cavity surface emitting laser (VCSEL). The length of the active region in the direction of the optical signal being amplified is longer.

When a potential is applied across the active region, the VCSEL begins lasing at a threshold current. The lasing field acts as a ballast and stabilizes the gain of the optical amplifier and makes the gain more linear. Thus, the optical amplifier and the VCSEL share the same gain medium. The optical fields of the optical amplifier and the VCSEL, however, propagate in orthogonal directions. The VCSEL may emit light out of the top (or bottom) surface, while the amplified optical signal emits from the side of the device.

The linear optical amplifier, which effectively combines a VCSEL and a semiconductor optical amplifier, provides linear gain. The gain, however, may be adversely affected by the DBR layers in the DBR stacks. The DBR layers form a multimode slab waveguide that is parallel to the active region. As a result, light can be lost from the active region due to evanescent coupling. The mode interaction between the active region and the DBR layers may also be wavelength dependent and may result in a loss in gain of the amplifier near the coupling wavelength.

One consequence of the mode interaction between the active region and the DBR layers is that the gain spectrum may exhibit areas where the gain dips, referred to as channel drops. If the gain spectrum exhibits channel drops, then the optical amplifier is usable over a relatively narrow bandwidth. The presence of gain drops can lessen the usefulness of the optical amplifier. Nearly constant gain over the wavelengths of interest is desired.

BRIEF SUMMARY OF AN EMBODIMENT OF
THE INVENTION

These and other limitations are overcome by the present invention, which relates to systems and methods for tuning a Distributed Bragg Reflector mirror stack. Embodiments of the invention eliminate the loss of light to the DBR layers by assuring that the modal index of the active region is not degenerate with the modal index of a DBR mode over a range of wavelengths.

In one embodiment, a segmented DBR stack with an altered duty cycle removes the resonance between the active region and the DBR stack such that dips in the gain spectrum are reduced or eliminated over a wavelength range of interest. The DBR stack is segmented by inserting spacer layers into the DBR stack. The location and separation of channel drops can be tuned by changing the number of segments and number of mirror pairs per segment. A 50 DBR mirror pair stack (each mirror pair includes 2 layers), for example, can be segmented by having 5 spacer layers and 5 segments of 10 mirror pairs. One of skill in the art can appreciate additional segmentations of the DBR stack in view of this disclosure.

The location of a channel drop can be further tuned by changing the duty cycle of the mirror pairs in the segmented DBR stack. The duty cycle is changed by altering the relative thickness of the layers in a mirror pair. This ensures that the optical phase shift associated with a mirror pair remains constant, but the phase shift induced by the individual layers changes. In other words, the phase shift of the individual layers is more or less than 90 degrees while the phase shift of the mirror pairs remains 180 degrees. Changing the duty cycle reduces the reflectivity of the DBR mirror stack negligibly while enabling the location of the channel drop to be placed outside of the wavelengths of interest.

These and other advantages and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF EMBODIMENTS
OF THE INVENTION

The present invention relates to systems and methods for tuning a distributed Bragg reflector (DBR) stack. Tuning a DBR stack flattens the gain spectrum with respect to wavelength and helps avoid dips or channel drops. The ability to tune the location of a channel drop enables the optical amplifier to operate over a wider wavelength range. Conventional DBR stacks maximize reflectivity by ensuring that the optical path through each layer of the DBR stack is ¼ wave, corresponding to a phase shift of 90 degrees.

Embodiments of the invention change the duty cycle of the DBR layers such that the optical path through each layer is more or less than 90 degrees. The altered duty cycle can be configured to have a negligible effect on the reflectivity and thereby a minimal effect on the performance of the VCSEL aspect of the optical amplifier.

The usefulness of an optical amplifier increases if it does not have channel drops in its wavelength band of operation. A conventional DBR stack forms an independent waveguide that is a multimode waveguide. When the amplifier mode matches or resonates with a mode of the DBR stack, power is coupled into the DBR stack and loss occurs for the amplifier mode. As previously explained, this corresponds to a dip in the gain spectrum or a channel drop.

Embodiments of the invention remove this resonance by managing the spatial overlap and/or the spectral overlap of the matching or interacting modes. The spatial overlap is managed by engineering the mode distribution of the DBR using spacer layers. The DBR mirror stack is divided into segments and spacer layers are grown between the segments. Because the DBR layers of the DBR stack are now segmented, each segment has fewer modes and larger modal index spacing than a conventional DBR mirror stack. In fact, the modal indices of the structure are clustered around the segment modes and a gap occurs in the modal index distribution. The gap is related to the thickness of the spacer layers. The gap provides the optical amplifier with a large wavelength range between resonances or channel drops.

The channel drop can further be tuned by changing the duty cycle of the layers in each mirror pair. The duty cycle can be changed by changing the relative thickness of each layer in a mirror pair. The phase change of the mirror pair remains constant at 180 degrees, but the phase change of each layer is no longer 90 degrees. A change in the duty cycle can move a channel drop outside of the wavelength range of interest. In another embodiment, the use of a segmented DBR may be combined with an altered duty cycle.

Figure 1:
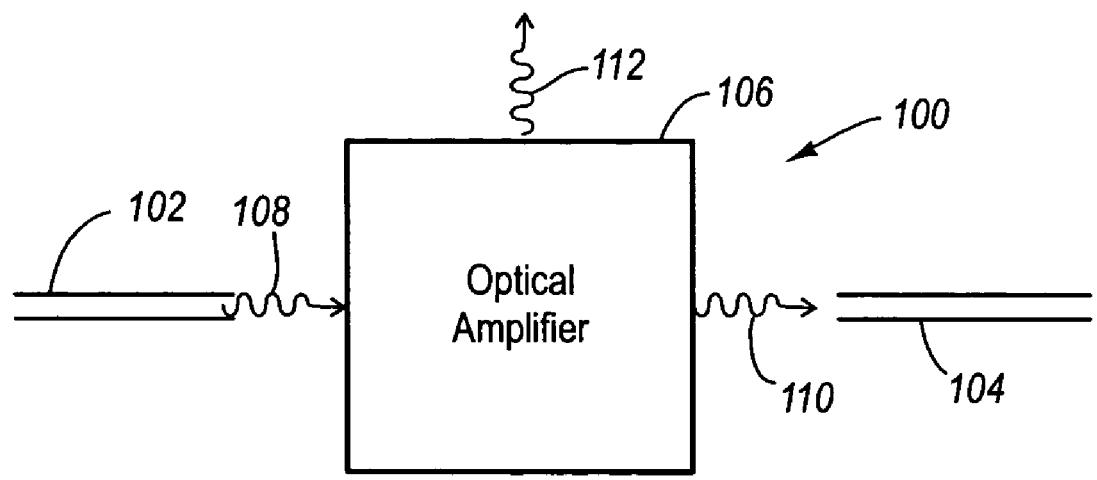
FIG. 1 illustrates an exemplary environment for implementing embodiments of the invention.

FIG. 1 illustrates an exemplary system for amplifying optical signals. Optical signals are amplified by the optical amplifier 106, which includes tuned DBR layers. Tuning DBR layers may relate, by way of example and not limitation, to the segmentation of the DBR stacks. For example, segmenting a DBR stack may refer to the number of segments in the DBR stack and/or the number of mirror pairs per segment. Tuning DBR layers may also relate to, attributes of the spacer layers between the DBR segments, and a duty cycle in the mirror pairs of the DBR stack. In this example, the optical amplifier 106 includes a vertical cavity surface emitting laser (VCSEL) that emits a lasing signal 112. The lasing signal 112 acts as a ballast to stabilize the optical gain imparted to the input signal 108 by the optical amplifier 106.

The operation of an optical amplifier is simplified as follows. An input optical fiber 102 carries an input signal 108. The input signal 108 exits the fiber 102 and is incident to the optical amplifier 106. The facet of the optical amplifier 106 may be angled to limit mode reflections. Because the device 100 is an optical amplifier, the length of the active region parallel to the direction of travel of the optical signal being amplified is longer than the length of a typical VCSEL.

The input signal 108 passes through an active region of the optical amplifier 106 where it is amplified by stimulated emission. The signal exits the optical amplifier 106 is launched into the fiber 104 as the amplified signal 110. As illustrated, the optical signal being amplified travels in a direction that is substantially orthogonal to the laser or ballast signal 112.

The DBR layers are substantially parallel to the active region and, as previously stated, the optical signal being amplified can optically couple into the DBR mirrors to reduce the gain imparted to the incident optical signal 108. In other words, the gain spectrum exhibits a dip in the gain or a channel drop at the wavelengths where the DBR mirrors couple more strongly with light propagating in the active region. In examples of the invention, the DBR mirrors of the VCSEL can be formed during manufacture to tune a location of a drop in gain that may be associated with the coupling of the incident light signal with the DBR layers. Thus, embodiments of the invention tune the channel drop(s) such that they reside outside of the wavelengths of interest. Advantageously, optical amplifiers can then be formed for specific wavelength ranges. The ability to tune the location of the channel drop expands the range of wavelengths that can be amplified.

Figure 2:
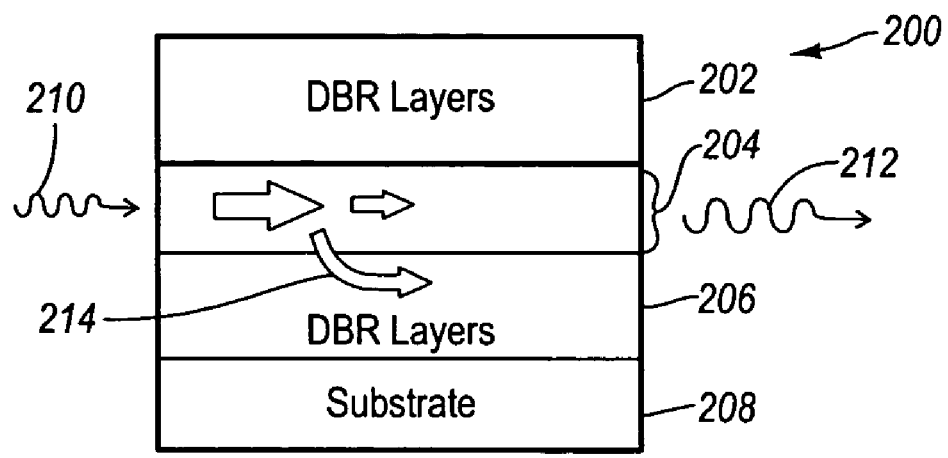
FIG. 2 illustrates an optical signal that couples with the DBR layer stack, thereby resulting in a channel drop.

FIG. 2 illustrates side view of an optical amplifier. In this example, the incident optical signal 210 enters the optical amplifier 200 and exits the optical amplifier as the amplified signal 212. FIG. 2 illustrates that the active region 204 is bounded by DBR stacks illustrated as the DBR layers 202 (which may be either p-type or n-type layers) and the DBR layers 206 (which may be n-type layers). The arrow 214 represents light that optically couples to the DBR layers 206 from the active region 204. As previously discussed, light that couples into the DBR layers corresponds to dips in the gain spectrum and typically reduces the linearity of the gain spectrum of the optical amplifier 200.

Figure 3A:
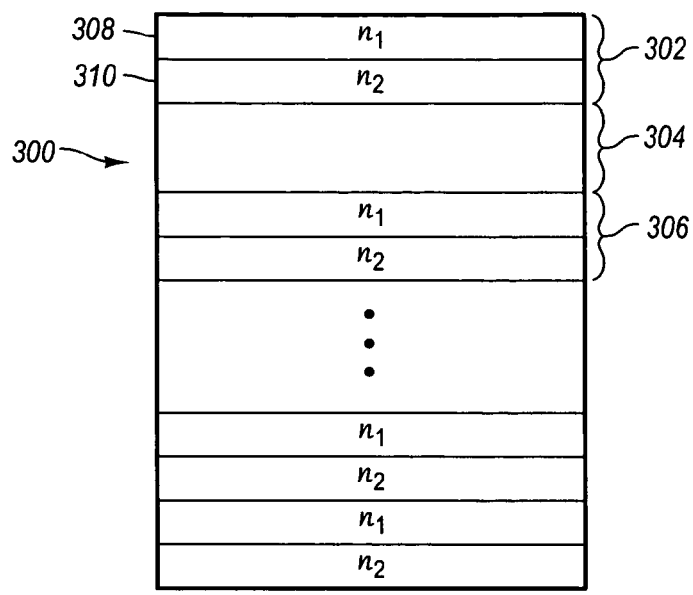
FIG. 3A illustrates one example of a DBR stack.

FIG. 3A illustrates an exemplary set of DBR layers 300 that corresponds to a DBR stack. Many optical amplifiers have two DBR stacks or sets of DBR layers and embodiments of the invention may be practiced in one or both DBR stacks. DBR layers 300 are typically arranged in mirror pairs, such as exemplary pairs 302, 304, and 306. Each pair is substantially similar to the other pairs in the DBR layers 300. In this example, the pair 302 includes a layer 308 and a layer 310. The layer 308 has a refractive index that is different from the refractive index of the layer 310 and, conventionally, each layer in each pair is ¼ wavelength thick. For the lasing signal, which provides the ballast signal for optical amplification, the reflections of light from the DBR interfaces add in phase to produce laser light.

In one embodiment, the thickness of the layers 308 and 310 are altered such that the phase shift is greater or less than 90 degrees. Tuning the duty cycle of the layers by changing the relative thickness of each layer can alter the location of any associated channel drop of the optical amplifier.

Figure 3B:
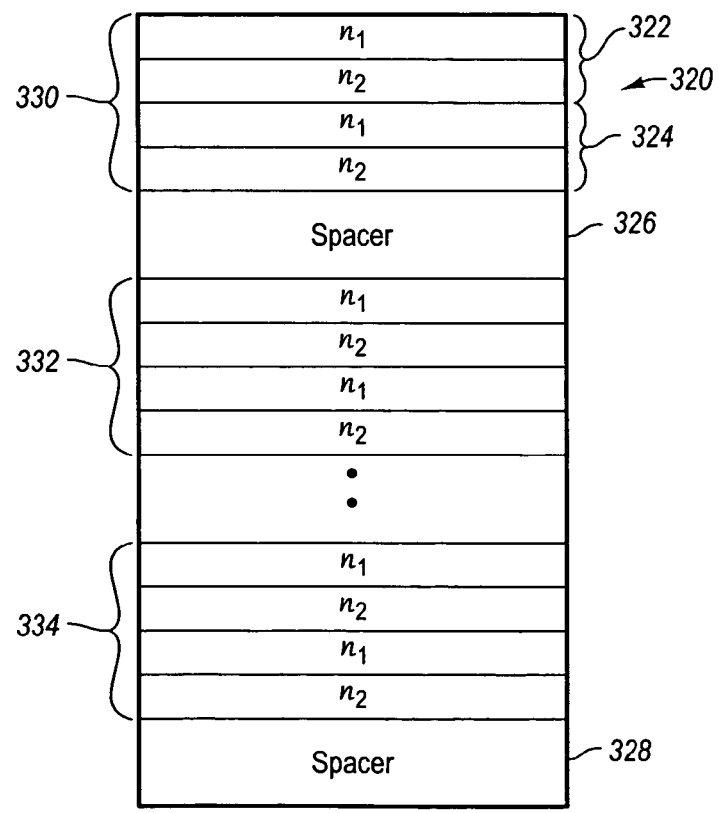
FIG. 3B illustrates one example of a segmented DBR stack.
Figure 3C:
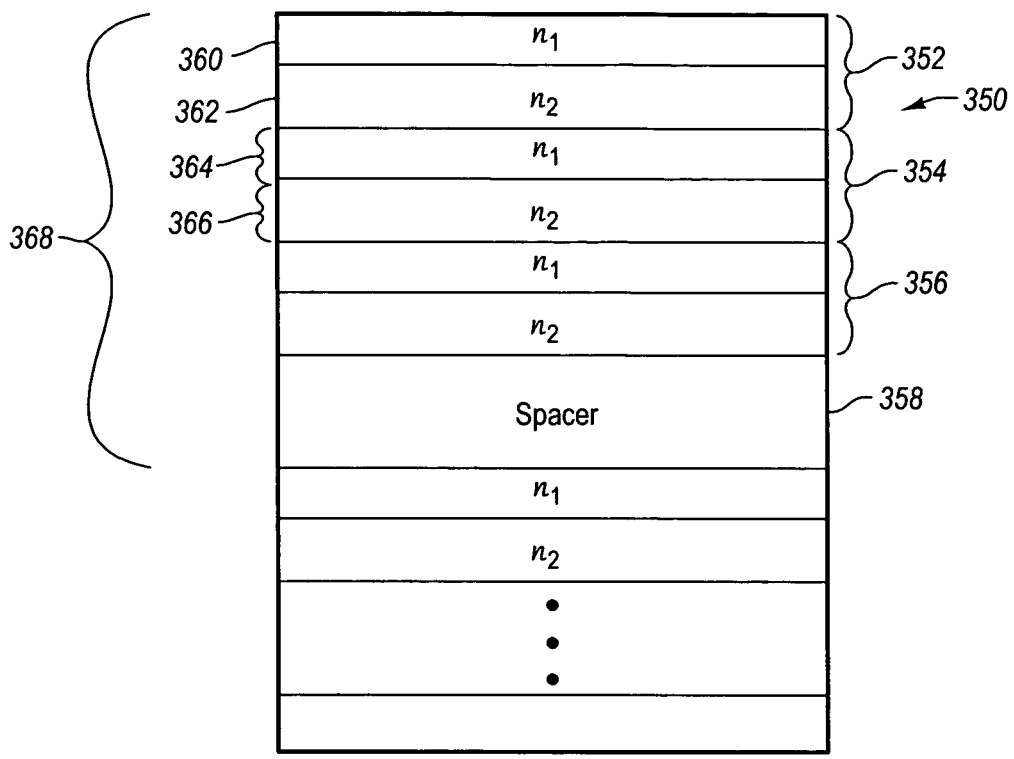
FIG. 3C illustrates one example of a segmented DBR stack where the duty cycle of the mirror pairs has been changed.

FIGS. 3B and 3C illustrate alternative embodiments of DBR layers that enable an optical amplifier to be tuned. The DBR layer structure 320 include, for example, pairs 322 and 324. Each pair 322 and 324 includes layers having different refractive indices. The DBR layer structure 320 also includes spacer layers represented by the spacer layers 326, 328. The DBR layers thus includes a plurality of spacer layers that are separated by one or more pairs of DBR layers.

The spacer layers (represented by the spacer layer 326 and 328) reduce or eliminate the spectral overlap of the optical modes supported by the DBR layers and the optical modes supported by the active region. The spacer layers can be formed by dividing the DBR layers into a number of smaller subsections or segments 330, 332, 334. Because the segments 330, 332, and 334 have a smaller size relative, for example, to the DBR layers 300 of FIG. 3A, each segment has fewer modes and larger modal index spacing than an entire DBR mirror. By separating the segments spatially as illustrated in FIG. 3B, the modal indices of the structure 320 are clustered near the modal indices of the segment modes. By clustering the modal indices, a gap appears in the modal index distribution and provides a range of wavelengths between resonances. The gain spectrum thus does not experience a dip between resonances.

Embodiments of the invention enable the location of a channel drop to be adjusted by changing the duty cycle of the mirror pairs in the DBR layers of a optical amplifier. For example, one of the layers in a typical mirror pair is InP. The other layer in the mirror pair is InGaAsP. The optical path length through each layer is conventionally configured to be ¼ wavelength and corresponds to a phase shift of 90 degrees. Such a configuration maximizes the reflectivity of the DBR layers for some number of mirror pairs. For 1550 nm light (assuming that the bandgap of the InGaAsP is 1345 nm and that the index of refraction is approximately 3.455), a mirror pair may include a layer of InP having a thickness of 122.4 nm followed by a 112.2 nm layer of InGaAsP.

The number of pairs in each segment has an impact on the location of the channel drop. By way of example and not limitation, each segment may include from 9 to 15 pairs of mirror pairs. One of skill in the art can appreciate that each segment can include more or fewer pairs, however. The addition or removal of a mirror pair can determine whether the amplifier mode is near resonance with the DBR stack.

In addition to segmented DBR layers, the duty cycle of the layers in the mirror pairs can tune the location of a channel drop. Changing the duty cycle of the mirror pairs, in one embodiment, does not change the phase shift of a mirror pair. Instead, the phase shift of one of the layers in the mirror pair is different from the phase shift of the other layer in the mirror pair. In this embodiment, the phase shift for a pair remains 180 degrees, while the phase shift for the layers in each pair is changed.

When the mirror pair includes a layer of InP and a layer of InGaAsP, for example, the phase shift of an InP layer is different from the phase shift of the InGaAsP layer. A change in the duty cycle of the DBR layers has an effect on the DBR reflectivity. In one example, a 20% duty cycle change is negligible for a 50 mirror pair DBR stack. A 20% duty cycle corresponds, in one example, to a 0.02% excess loss.

FIG. 3C illustrates an example of DBR layers having mirror pairs where the duty cycle of the mirror pairs is altered. In the mirror pair 352 (and accounting for differences in the refractive index of the layers in a mirror pair), for example, the layer 360 is thinner than the layer 362. The mirror pair 354, and 356 are similarly configured. The segment 368 may include multiple mirror pairs and a spacer layer 358.

FIGS. 4 through 7 illustrate some of the effects of tuning the DBR stack(s) of an optical amplifier described herein. Generally stated, tuning the DBR stacks creates a gap in the distribution of the modal indices in the DBR stack. The gap corresponds to wavelengths of substantially linear amplification. The location of the gaps can be tuned as described herein.

In addition, an optical amplifier such as a vertical lasing semiconductor optical amplifier can have two DBR stacks. Each DBR stack can be segmented and the segmentation and/or duty cycle of each stack can be different. In fact, the duty cycle from one segment of a DBR stack to the next segment can also be controlled. In other words, the duty cycle is not required to be constant across an entire DBR stack or across a segment of a DBR stack. Also, the number of mirror pairs in each segment can vary.

Figure 4:
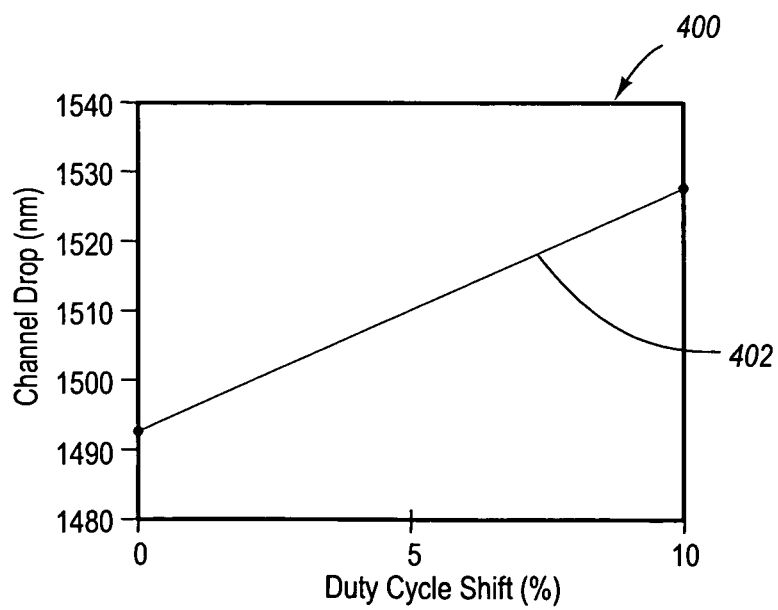
FIG. 4 illustrates an example of the location of a channel drop with respect to duty cycle shift.

FIG. 4 illustrates a plot 400 of the variation of the location of the channel drop 402 with changes in the duty cycle of the DBR pairs. The slope, in this example, is approximately 4.3 nm per 1% change in duty cycle. This enables a significant amount of freedom with a 20% duty cycle shift. In the C-band, which corresponds to a wavelength range over which an optical amplifier may operate in one example, a 10% change in the duty cycle can move a channel drop across the entire band.

Figure 5:
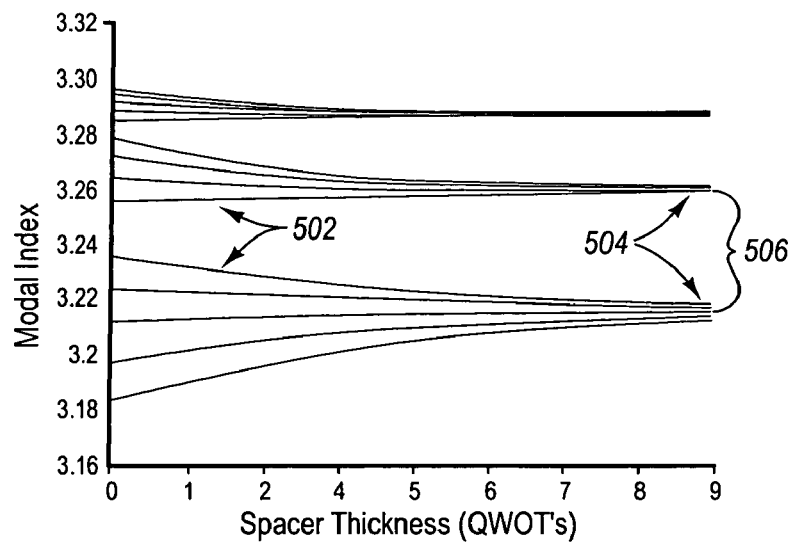
FIG. 5 illustrates the clustering of the modal indices related to the thickness of spacer layers in a segmented DBR stack.

FIG. 5 illustrates modal index distribution as a thickness of the spacer layers in the DBR stack increases. As the thickness of the spacer layer increases, the distribution 502 clusters to the distribution 504 and opens up a gap 506 in the modal distribution as previously described.

Figure 6:
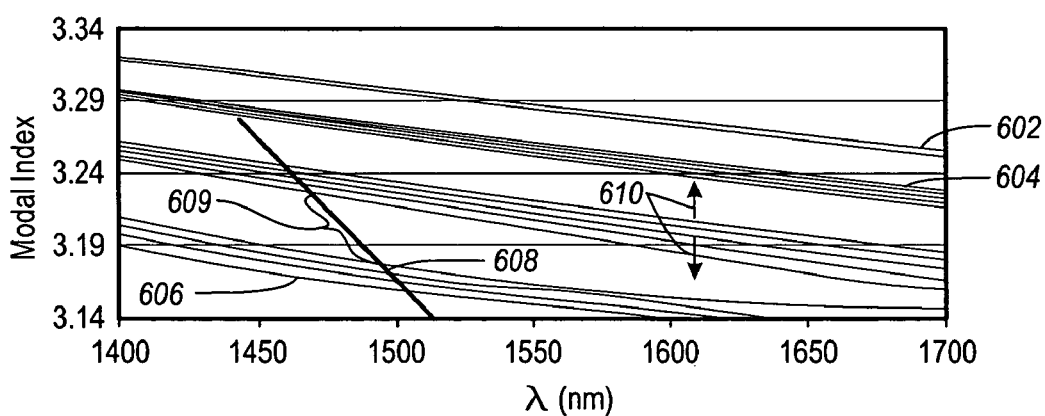
FIG. 6 illustrates the tenability of the segmented DBR stack.

FIG. 6 plots the modal index of the modes supported by the DBR stacks shown in FIGS. 3B and 3C as a function of wavelength. The modal index is equal to the speed of light in vacuum divided by the phase velocity of a mode. The plot 608 corresponds to the amplifier mode and the plots 602, 604, and 606 correspond to the modes of the DBR stack. In this example, the spacer layers and/or the duty cycle change produces the clustered plots 602, 604, and 606. The range 609 thus corresponds to wavelengths that experience less dip in the gain spectrum. Locations where the plot 608 crosses the plots 602, 604, and 606 correspond to dips in the gain spectrum. As previously stated, the change in the duty cycle of the layers in the mirror pairs can shift the location of the plots 602, 604, and 606 as illustrated by the arrows 610. This can tune or move the range 609 that can be amplified by an optical amplifier. In other words, the duty cycle can be configured to tune a segmented DBR stack.

Figure 7:
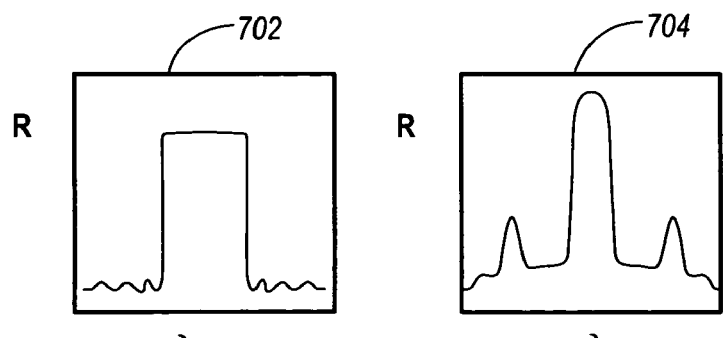
FIG. 7 illustrates the reflectivity of a conventional DBR stack compared with a segmented DBR stack with an altered duty cycle.

FIG. 7 compares a reflectivity plot 702 with the reflectivity plot 704. The plot 702 corresponds to a conventional DBR where the reflectivity is high for a given wavelength or range of wavelengths. The plot 704 is more narrow, but has wings. One advantage of the plot 704 is that it can help determine what was actually grown in a segmented DBR stack with DBR layers having a particular duty cycle. The knowledge of what was actually grown can be used later to insure that a particular duty cycle is grown.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical amplifier comprising:
   a substrate;
   a first Distributed Bragg Reflector (DBR) stack arranged over the substrate, the first DBR stack including a plurality of mirror pairs each having a first layer and a second layer, wherein a duty cycle of each mirror pair is selected such that a phase shift of the first layer is less than or greater than 90 degrees;
   an active region formed on the first DBR stack, wherein the duty cycle of each mirror pair is selected such that an amplifier mode does not couple to the first DBR stack; and
   a second DBR stack formed on the active region.

2. An optical amplifier as defined in claim 1, wherein each mirror layer further comprises a layer of InP and a layer of InGaAsP.

3. An optical amplifier as defined in claim 1, wherein the duty cycle is in a range of 1% to 20%.

4. An optical amplifier as defined in claim 1, wherein the first DBR stack includes a plurality of spacer layers such that the plurality of mirror pairs is divided into segments.

5. An optical amplifier as defined in claim 4, wherein each spacer layer comprises a layer of InP having a thickness that is a multiple of ½ wave and imparting a phase shift equal to a multiple of 180 degrees.

6. An optical amplifier as defined in claim 4, wherein each segment includes a particular number of mirror pairs in a range from 9 to 15 mirror pairs.

7. An optical amplifier as defined in claim 4, wherein the first DBR stack includes segments in a range from 2 to 5 segments.

8. An optical amplifier as defined in claim 1, wherein a phase shift of each mirror pair is 180 degrees.

9. An optical amplifier as defined in claim 1, wherein the second DBR stack includes a plurality of mirror pairs each having a first layer and a second layer, wherein a duty cycle of each mirror pair in the second DBR stack is selected such that a phase shift of the first layer is less than or greater than 90 degrees.

10. An optical amplifier comprising:
a substrate;
a first DBR stack formed on the substrate, wherein the first DBR stack comprises:
a plurality of mirror pair segments, each mirror pair in each mirror pair segment imparting a phase shift of 180 degrees and each mirror pair having a duty cycle such that a first layer of each mirror pair imparts a phase shift of less than 90 degrees and a second layer of each mirror pair imparts a phase shift of greater than 90 degrees;
an active region formed on the first DBR stack, wherein the duty cycle of each mirror pair is configured to tune a channel drop outside of a particular range of wavelengths; and
a second DBR stack formed on the active region.

11. An optical amplifier as defined in claim 10, wherein the first layer is InP and the second layer is InGaAsP.

12. An optical amplifier as defined in claim 10, wherein the first layer is InGaAsP and the second layer is InP.

13. An optical amplifier as defined in claim 10, wherein the first mirror stack comprises a plurality of spacer layers located at least between each mirror pair segment.

14. An optical amplifier as defined in claim 10, wherein each mirror pair segment includes a number of mirror pairs in a range from 9 to 15 mirror pairs.

15. An optical amplifier as defined in claim 10, wherein the first layer has an optical path that is less than ¼ wave.

16. An optical amplifier as defined in claim 10, wherein the duty cycle is selected to move a location of a channel drop.

17. An optical amplifier as defined in claim 10, wherein the duty cycle is in a range of 1% to 20%.

18. A method for tuning a location of a channel drop in a gain spectrum of an optical amplifier, the method comprising:
selecting a duty cycle for a plurality of mirror pairs such that a channel drop falls outside of a selected wavelength range;
forming first DBR layer that includes a plurality of mirror segments on a substrate, each mirror segment including one or more of the plurality of mirror pairs and a spacer layer;
forming an active region on the plurality of mirror segments; and
forming a second DBR stack on the active region.

19. A method as defined in claim 18, further comprising:
forming a first layer of each mirror pair such that a phase shift of the first layer is less than 90 degrees; and
forming a second layer of each mirror pair such that a phase shift of the second layer is greater than 90 degrees.

20. A method as defined in claim 19, further comprising forming each mirror pair such that a phase shift of each mirror pair is 180 degrees.

21. A method as defined in claim 18, wherein the first layer is InP and the second layer is InGaAsP.

22. A method as defined in claim 18, wherein the first layer is InGaAsP and the second layer is InP.

23. A method as defined in claim 18, further comprising angling a first facet and a second facet of the optical amplifier to limit mode reflections in the active region.

24. A method as defined in claim 18, wherein each mirror segment comprises a number of mirror pairs in a range of 9 to 15.

25. A method as defined in claim 18, wherein the duty cycle is in a range of 1% to 20%.

26. An optical amplifier comprising:
a substrate;
a first DBR stack formed on the substrate, wherein the first DBR stack comprises:
a plurality of mirror segments;
one or more mirror pairs in each mirror segment, wherein each mirror pair has a duty cycle such that a phase shift for each mirror pair is 180 degrees while the phase shift for one layer in at least one mirror pair is less than 90 degrees; and
one or more spacer layers formed between the plurality of mirror segments;
an active region formed on the first DBR stack; and
a second DBR stack formed on the active region.

27. An optical amplifier as defined in claim 26, wherein a duty cycle of a first mirror pair in the first DBR stack is different from a duty cycle of a second mirror pair in the first DBR stack.

28. An optical amplifier as defined in claim 26, wherein a duty cycle of mirror pairs in the first DBR stack is not constant.

29. An optical amplifier as defined in claim 26, wherein a first segment in the first DBR stack has a first number of mirror pairs and a second segment in the first DBR stack has a second number of mirror pairs.

30. An optical amplifier as defined in claim 26, wherein the second DBR stack comprises:
a plurality of mirror segments;
one or more mirror pairs in each mirror segment, wherein each mirror pair has a duty cycle such that a phase shift for each mirror pair is 180 degrees while the phase shift for one layer in at least one mirror pair is less than 90 degrees; and
one or more spacer layers formed between the plurality of mirror segments.

31. An optical amplifier as defined in claim 26, wherein each spacer layer has a thickness that is a multiple of ½ wave and imparts a phase shift equal to a multiple of 180 degrees.

* * * * *